(12) United States Patent
Sheokand et al.

(10) Patent No.: US 12,451,580 B2
(45) Date of Patent: Oct. 21, 2025

(54) SELECTIVELY COUPLED POWER SPLITTER

(71) Applicant: Murata Manufacturing Co., Ltd., Nagaokakyo (JP)

(72) Inventors: Anoop Sheokand, Lake Forest, CA (US); Emre Ayranci, Costa Mesa, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 198 days.

(21) Appl. No.: 18/457,225

(22) Filed: Aug. 28, 2023

(65) Prior Publication Data

US 2025/0079679 A1 Mar. 6, 2025

(51) Int. Cl.
*H01P 5/16* (2006.01)
*H03H 7/00* (2006.01)

(52) U.S. Cl.
CPC .................. *H01P 5/16* (2013.01); *H03H 7/00* (2013.01)

(58) Field of Classification Search
CPC .......... H03H 7/48; H03H 7/09; H03H 7/0115; H03H 11/362; H03H 2001/0078; H03H 2210/025; H03H 7/0123; H03H 7/185; H03H 7/46; H03H 7/461; H03H 7/38;
(Continued)

(56) References Cited

U.S. PATENT DOCUMENTS 8,130,057 B2    3/2012    Jones et al.
2014/0152398 A1*   6/2014    Kayahara ................. H03H 7/46
                                                                                                                333/131
(Continued)

FOREIGN PATENT DOCUMENTS

CN        217135460 U    8/2022
WO    2020/053141 A1   3/2020

OTHER PUBLICATIONS

M. Love, M. Thian, F. van der Wilt, K. van Hartingsveldt and K. Kianush, "Lumped-Element Wilkinson Power Combiners Using Reactively Compensated Star/Delta Coupled Coils in 28-nm Bulk CMOS," in IEEE Transactions on Microwave Theory and Techniques, vol. 67, No. 5, pp. 1798-1811 (Year: 2019).*

(Continued)

*Primary Examiner* — Lincoln D Donovan
*Assistant Examiner* — Tyler J Pereny
(74) *Attorney, Agent, or Firm* — Steinfl + Bruno LLP

(57) ABSTRACT

Methods and devices for enhancing performance of a power splitter are presented. According to one aspect, the power splitter is realized via lumped elements that include inductively coupled coils. Values of the lumped elements are based on an equivalent circuit of the power splitter that includes a star topology provided by a mutual inductance connected to a first port of the power splitter and respective inductances of the inductively coupled coils modified by the mutual inductance connected between the mutual inductance and respective second and third ports of the power splitter. A coupling factor of the inductively coupled coils has a magnitude that is in a range from 0.15 to 0.45. The coupling factor is negative. Respective capacitors are connected to the ports of the power splitter. The respective capacitors include switchable capacitors.

26 Claims, 14 Drawing Sheets

(58) Field of Classification Search
CPC ...... H01P 5/16; H01P 5/19; H01P 5/12; H01P 5/185; H01P 1/18
See application file for complete search history.

(56) References Cited

U.S. PATENT DOCUMENTS

2021/0135646 A1* 5/2021 Lin ..................... H03H 7/185
2022/0216582 A1* 7/2022 Golat .................... H01P 5/16

OTHER PUBLICATIONS

International Search Report and Written Opinion for International Patent Application PCT/JP2024/030322 filed Aug. 26, 2024 on behalf of Murata Manufacturing Co., Ltd., Mail Date: Dec. 5, 2024. 13 pages.

* cited by examiner

SELECTIVELY COUPLED POWER SPLITTER

TECHNICAL FIELD

The present teachings relate to radio frequency (RF) circuits. More particularly, the present teachings relate to methods and apparatuses for improving performances of a power splitter, such as a Wilkinson power splitter, via inductive coupling.

BACKGROUND

FIG. 1A shows a prior art Wilkinson (power) splitter (100A) that can be used to split an input RF signal at a (common) port, P1, into two (substantially) equal phase and (substantially) equal power RF signals at ports P2 and P3. Conversely, the splitter (100A) can be used to combine two equal phase RF signals at ports P2 and P3 into one RF signal at port P1. As can be seen in FIG. 1A, the prior art splitter (100A) is a three-port network, wherein ports P1 and P2 are coupled to respective ends of a first quarter wavelength (i.e., λ/4) transmission line (112a) and ports P1 and P3 are coupled to two respective ends of a second quarter wavelength (i.e., transmission line (113a). A termination resistor, $R_{23}$, (e.g., isolation/ballast resistor) connected between ports P2 and P3 provides output impedance matching at the two ports P2 and P3, as well as isolation between ports P2 and P3 (i.e., essentially no current flows through the resistor). As known to a person skilled in the art, principle of operation of the splitter (100A) is based on: i) a length of the two transmission lines (112a, 113a) to be equal to one fourth (¼) of a wavelength, λ, that is based on a frequency of operation (e.g., center frequency) of the splitter (100A); and ii) in order to provide impedance matching between the port P1 and respective ports P2 and P3, at an impedance value $Z_o$, a characteristic impedance (i.e., impedance at the frequency of operation) of the two transmission lines (112a, 113a) must be equal to $\sqrt{2} * Z_o$, and the impedance of the termination resistor, $R_{23}$, must be $2*Z_o$.

Although the prior art splitter (100A) can operate at high frequencies (e.g., center frequencies of 10 GHz and higher) thanks to its distributed elements (e.g., transmission lines) realization, its bulkiness may render it impractical for integration purposes. Accordingly, in many applications, a lumped elements approach may be used to realize a Wilkinson splitter as shown in FIG. 1B. In such prior art approach, a Wilkinson splitter (100B) implements functionality (e.g., at the center frequency) of the two branches between port P1 and respective ports P2 and P3 via respective (Pi-) LC branches (112b) and (113b). As can be seen in FIG. 1B, each of the two branches (112b) and (113b) includes a respective inductor $L_{12}$, $L_{13}$, connected (e.g., electrically coupled, directly coupled) at each end to respective shunted capacitors ($C_{12}$, $C_{21}$) and ($C_{13}$, $C_{31}$). For each of the branches (112b) and (113b), values of the respective elements/components ($L_{12}$, $C_{12}$, $C_{21}$) and ($L_{13}$, $C_{13}$, $C_{31}$) are chosen so that at the frequency of operation (e.g., center frequency), an equivalent impedance of each branch (e.g., provided by the respective inductor) is equal to $\sqrt{2} * Z_o$ and a phase shift through the branches is equal (e.g., −90 degrees in reference to port P1, e.g., as provided at resonance). It should be noted that a person skilled in the art is well aware of design techniques and practices (e.g., matching of scattering parameters) for providing an equivalent lumped elements realization (e.g., 112b, 113b) of a transmission line (e.g., 112a, 113a) used in a distributed elements realization of a power splitter, such as the Wilkinson splitter shown in FIG. 1B, which are therefore beyond the scope of the present application.

Performance of the prior art power splitter (100A, 100B) about a target center frequency may be derived from known in the art scattering parameters (e.g., S11, S21, S22, S23 and S33), such as, for example, a return loss performance (e.g., S11), an insertion loss performance (e.g., S21), or an isolation performance between ports P2 and P3 (e.g., S23). Such performance may be considered inherent to the design of the power splitter and therefore may be considered as a constant/fixed performance. In other words, for a given performance range defined, for example, by a minimum value of isolation, an acceptable bandwidth of operation about the center frequency may be predefined.

Accordingly, in cases where wider bandwidths of operation for a given performance metric may be desired, prior art configurations may resort to known techniques to widen the bandwidth while sacrificing other performance metrics. For example, one such technique to widen a bandwidth of operation with respect to an isolation performance may include use of a plurality of cascaded (stages of) power splitters, each centered at a slightly different center frequency to provide, in combination, a wider (acceptable) bandwidth of operation, but at the expense of a reduced/degraded insertion loss performance and a larger physical die area. Another such technique may use a resonant ballast load (e.g., R-L-C resonant network instead of the simple $R_2$ load of FIG. 1B) coupled to the power splitter for providing a wider bandwidth of operation, but at the expense of a reduced/degraded return loss performance and again a larger physical die area.

Not only can such known techniques for widening the bandwidth of operation of a power splitter be inefficient in terms of die area use and component count which may negatively affect cost and integration of the power splitter, but they also can degrade overall performance of the power splitter. Teaching according to the present disclosure describes a selectively coupled power splitter (e.g., Wilkinson power splitter) for provision of a wider bandwidth of operation without the drawback of the prior art configurations.

SUMMARY

According to a first aspect of the present disclosure, a power splitter is presented, comprising: a first LC branch connected between a first port and a second port; a second LC branch connected between the first port and a third port; and a termination resistor connected between the second port and the third port, wherein the first and the second LC branches comprise respective first and second inductors, and wherein the first inductor and the second inductor are inductively coupled according to a predefined nonzero coupling factor.

According to a second aspect of the present disclosure, a method for increasing a performance metric of a power splitter is presented, the method comprising: providing an equivalent circuit of the power splitter that includes inductively coupled first and second inductors in respective first and second LC branches of the power splitter; based on the providing, optimizing component values of the first and second LC branches, including inductances of the first and second inductors, for different nonzero values of a coupling factor between the first and second inductors; based on the optimizing, obtaining, for each nonzero value of the different nonzero values of the coupling factor, an optimized performance metric; and realizing the power splitter based on optimized component values of the first and second LC branches provided by an optimized nonzero value of the coupling factor that results in a higher optimized performance metric.

Further aspects of the disclosure are provided in the description, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronic devices (e.g., cell phones, radios, base stations, etc.) having a plurality of devices, such as for example, transistors (e.g., MOSFETs). Persons skilled in the art will appreciate that such electrical circuits comprising transistors can be arranged as amplifiers.

As used herein, the expression "operating frequency" can refer to a frequency of a signal being input to a device (such as an amplifier).

As used herein, the expression "center frequency" can refer to a reference frequency about which the operating frequency varies. The center frequency may be, for example, associated to a band or channel of operation of an RF communication system, and the operating frequency may be associated to a bandwidth of the band or channel of operation.

Figure 1B:
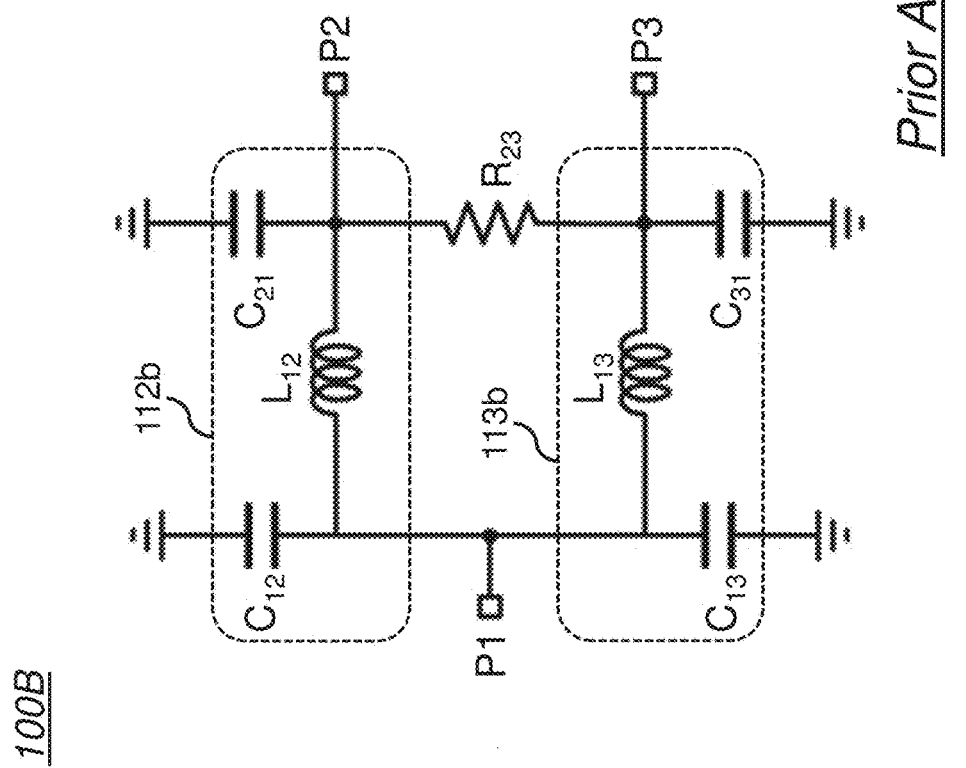
FIG. 1B shows a circuit of a prior art power splitter realized with lumped elements.
Figure 1A:
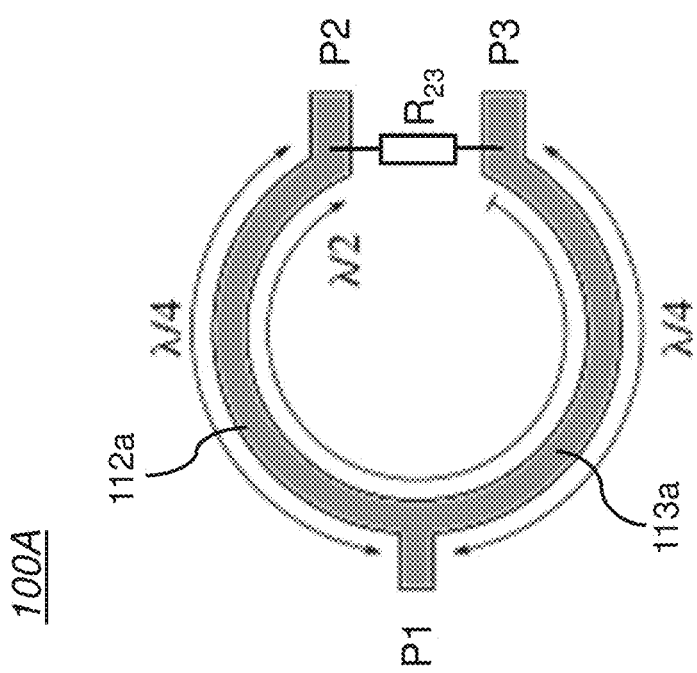
FIG. 1A shows a prior art power splitter realized with distributed elements.

With continued reference to the prior art power (Wilkinson) splitter (100B) of FIG. 1B, as noted above, for a given set of design parameters of the power splitter (100B), including for example a center frequency and a characteristic impedance of the transmission lines (e.g., 112B, 113B), values of the lumped elements/components (e.g., $C_{12}$, $C_{13}$, $C_{21}$, $C_{31}$, $L_{12}$, $L_{13}$, $R_{33}$) in order to achieve operation according to quarter wavelength transmission lines may be considered (essentially) fixed. In particular, due to the symmetry in design, and therefore operation, of the power splitter (100B), including symmetry between the two transmission lines (e.g., 112B, 1131B) and symmetry in signal flow (from P1 to P2/P3 and vice versa), the lumped elements may include equal values of capacitances for the capacitors (e.g., $C_{12}=C_{13}=C_{21}=C_{31}$) and equal values of inductances for the inductors (e.g., $L_{12}=L_{13}$).

Circuit designers may provide careful consideration in a layout/circuital implementation of the power splitter (100B) in order to achieve performances of a corresponding implementation that are consistent with the design. One such consideration may be a layout of the two inductors (e.g., $L_{12}$, $L_{13}$) in order to prevent or minimize inductive coupling, also traditionally considered as stray, parasitic or leakage inductance, which may affect effective inductances of the two inductors, and therefore degrade performance of the power splitter (100B). For example, as shown in the graphs of FIG. 1C, isolation (e.g., about a center frequency of 5.3 GHz) between ports P2 and P3 of an implementation of the of the prior art power splitter (100B) can substantially deviate from a nominal isolation $IL_{100}$ that does not include any inductive coupling (e.g., coupling factor k=0), to any one of (degraded) isolations $IL_{102}$, $IL_{104}$, $IL_{202}$ or $IL_{204}$ that include respective inductive couplings k=+0.2, k=+0.4, k=−0.2 or k=−0.4.

Because the design of the prior art power splitter (100B) is based on the circuit topology of FIG. 1B that is used as a model to implement functionality of the power splitter, including of the corresponding quarter wavelength transmission lines, only values of the elements shown in such model (e.g., $L_{12}$, $C_{12}$, $C_{21}$ and $L_{13}$, $C_{13}$, $C_{31}$) are derived and optimized in the design without considering any inductive coupling. Accordingly, as shown in the graphs of FIG. 1D, suboptimal performances at a target center frequency may be obtained in implementations that include an inductive coupling (e.g., graphs $IL_{102}$, $IL_{104}$, $IL_{202}$ or $IL_{204}$). As described later in the present disclosure, a model used to implement functionality of the selectively coupled power splitter according to the present disclosure is based on a circuit topology (e.g., FIG. 2A right side) that considers presence (e.g., effects) of an inductive coupling between inductors of the power splitter.

Figure 1C:
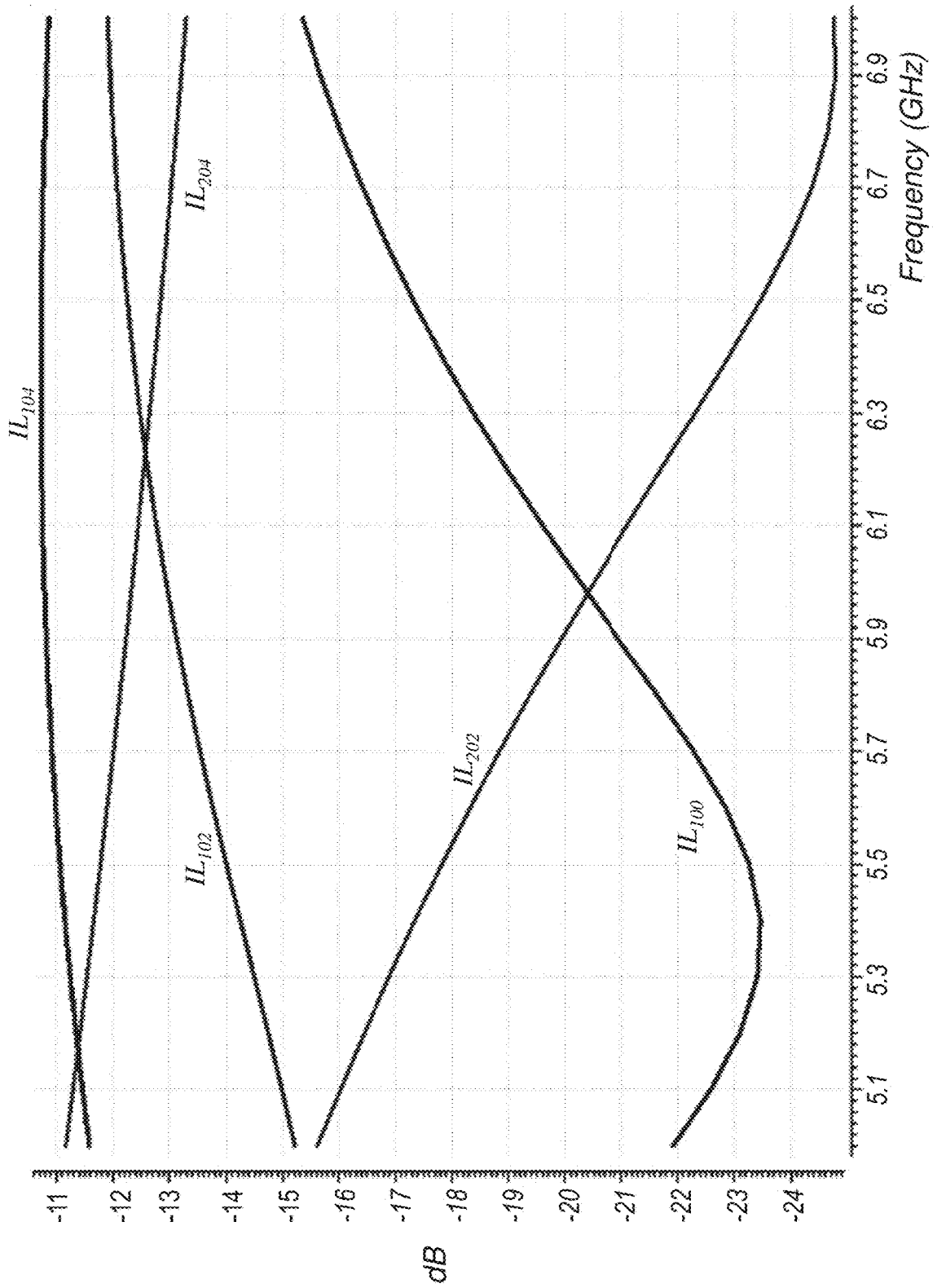
FIG. 1C shows graphs representative of effect of stray inductance in a performance of the prior art power splitter of FIG. 1B.
Figure 1D:
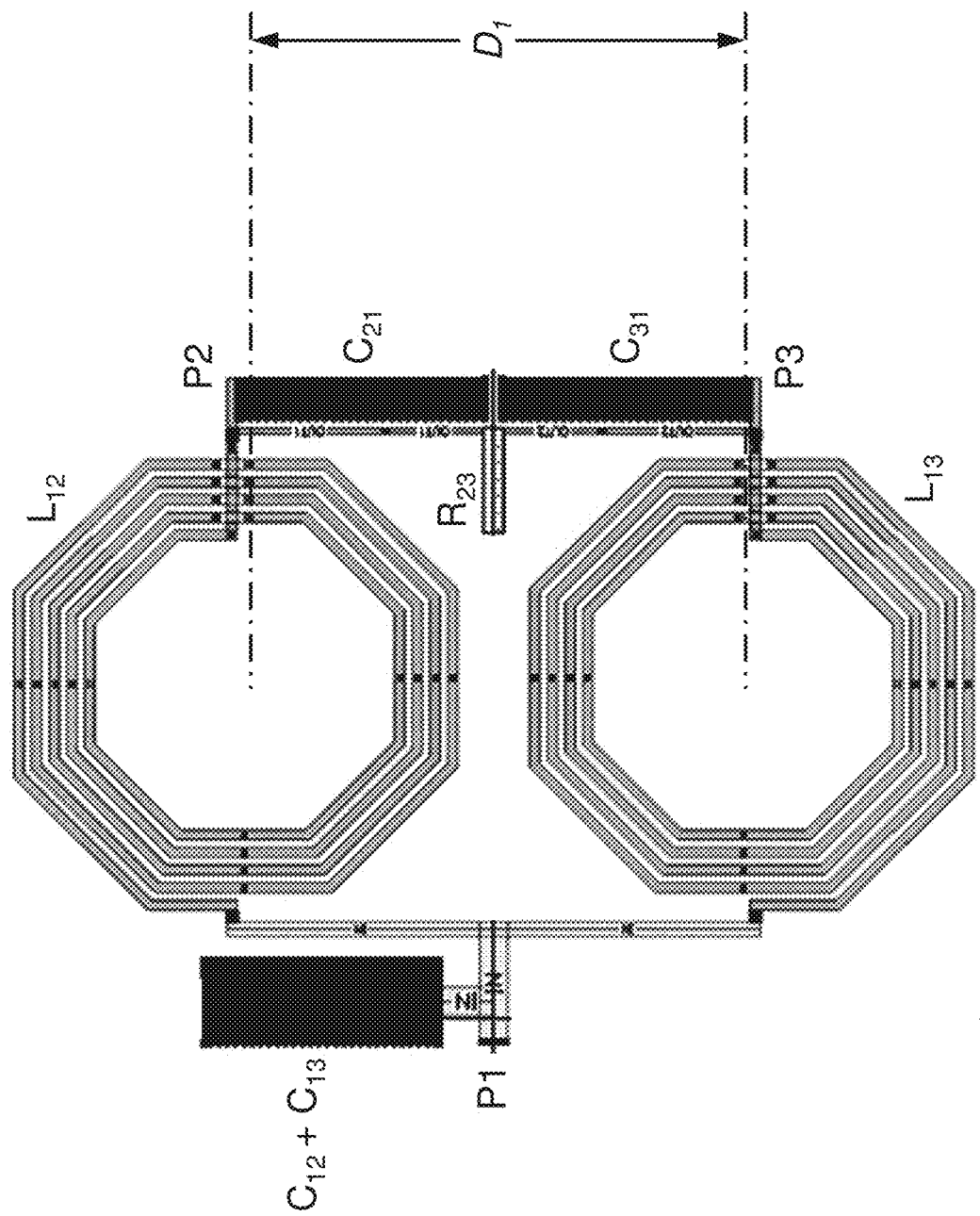
FIG. 1D shows an exemplary physical layout of two inductors used in a prior art power splitter.

As can be seen in the graphs of FIG. 1C, although at about the center frequency of interest (e.g., 5.3 GHz) the graph $IL_{202}$ corresponding to a coupling factor k=−0.2 shows a worse isolation performance compared to the graph $IL_{100}$, a minimum value of the isolation, therefore a best isolation performance, of the graph $L_{202}$ (e.g., at about 6.9 GHz) is lower/better than the minimum value (e.g., at about 5.3 GHz) of the isolation of the graph $L_{100}$. Teachings according to the present disclosure may take advantage of such lower isolation possible with inductively coupled inductors to design/implement an inductively coupled power splitter. It should be noted that as can be seen in the graphs of FIG. 1C, most nonzero coupling factors (e.g., k=+0.2; +0.4; −0.4) may provide a minimum value of the isolation that may be worse than the minimum value of the isolation of the graph $L_{100}$, and therefore, as traditionally treated, a nonzero coupling factor may appear as not desirable. In other words, teachings according to the present disclosure may be considered against conventional teachings where inductive coupling may be purposely eliminated/minimized. In other words, use of inductively coupled inductors having a nonzero coupling factor in order to achieve a better performance of the power splitter may appear as an unexpected result of the present teachings.

As known to a person skilled in the art, relative proximity of two inductors (e.g., $L_{12}$, $L_{13}$ of FIG. 1B) may cause an inductive coupling (i.e., magnetic coupling, mutual inductance) between the two inductors. Accordingly, traditional implementations, including for example implementation of the prior art power splitter (100B), may minimize/reduce such inductive coupling via, for example, a distance between respective coils used to form the two inductors (e.g., $L_{12}$, $L_{13}$ of FIG. 1B). For example, as shown in FIG. 1D, the respective coils (also annotated as $L_{12}$, $L_{13}$) that form the two inductors ($L_{12}$, $L_{13}$) may be positioned at a sufficiently large relative distance (D1, e.g., distance relative to centers of the two coils) to sufficiently reduce (e.g., remove) coupling of a magnetic field created by a current that flows through a coil of one inductor (e.g., $L_{12}$) to a coil of the other inductor (e.g., $L_{13}$), and vice versa. By reducing/removing the coupling of the respective magnetic fields between the two coils, mutual inductance between the two coils may be reduced/removed and a designed performance of the power splitter (100B) may be approached or achieved. However, as described above, the designed performance of the prior art power splitter (100B) may be limited by the architecture of the design, including requirements imposed to each of the two branches (112B) and (113B). It should be noted that in order to maintain a minimum form factor, inductors (e.g., $L_{12}$, $L_{13}$ of FIG. 1B) of the prior art power splitter (100B) may be separated by a distance that may not be sufficient to completely remove inductive coupling between the two inductors, thereby resulting in a (compromised/degraded) performance that is different from the designed performance.

Figure 2A:
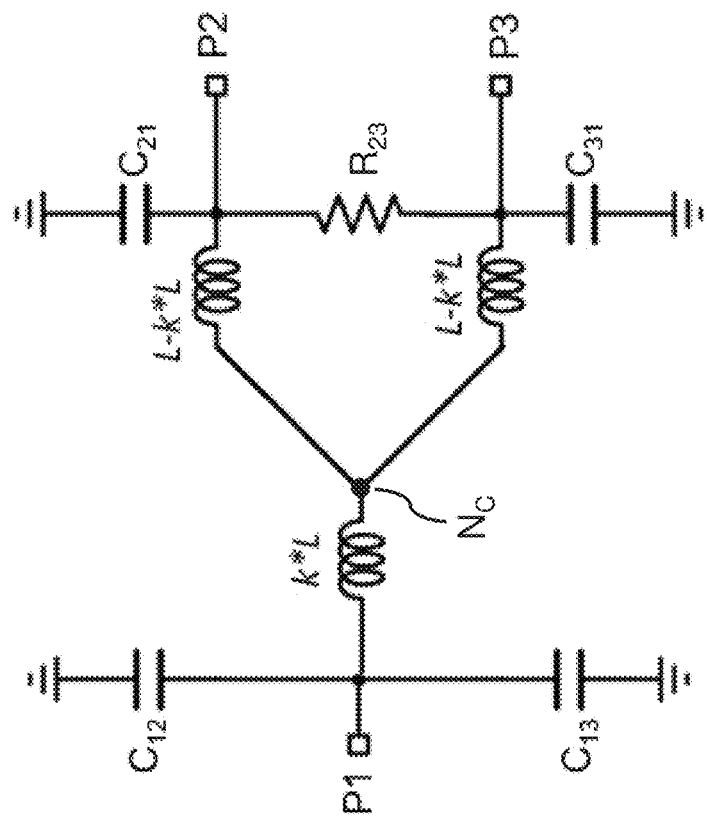
FIG. 2A shows a representative schematic of a selectively coupled power splitter according to an embodiment of the present disclosure and a corresponding equivalent circuit.
Figure 2A:
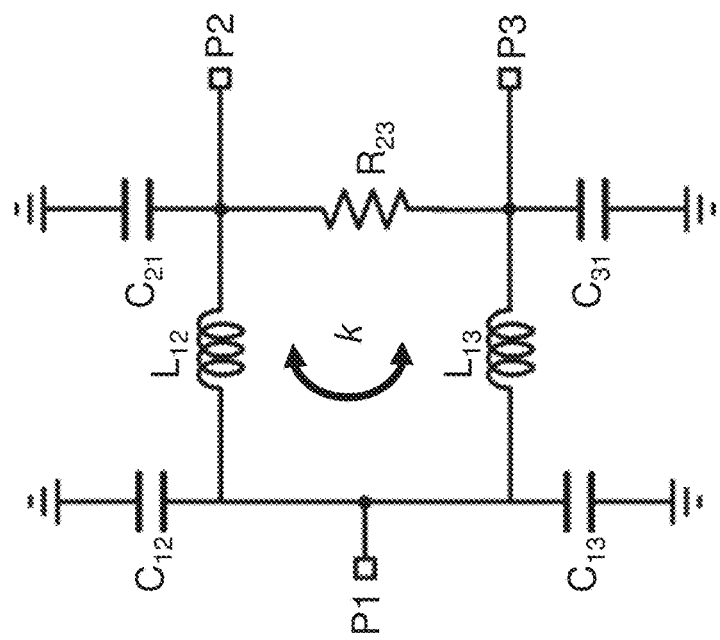

Left side of FIG. 2A shows a representative schematic of a selectively coupled power splitter (200A) according to an embodiment of the present disclosure. In stark contrast to the prior art power splitter (e.g., 100B of FIG. 1B), design of the selectively coupled power splitter (200A) according to the present disclosure includes (designed-in) mutually coupled inductors $L_{12}$ and $L_{13}$ having a (designed-in, predefined, pre-established) nonzero coupling factor, k, (where −1≤k≤+1). Such nonzero coupling factor, k, in turn generates a mutual inductance that for a case where $L_{12}$ and $L_{13}$ have a same inductance, L, is equal to k*L. Accordingly, as shown on the right side of FIG. 2A, an equivalent circuit of the selectively coupled power splitter (200A) includes the mutual inductance, k*L, connected between the first/common port, P1, and a common node, $N_c$, and effective inductances, L−k*L, connected between the common node, $N_c$, and respective ports P2 and P3. It should be noted that the effective inductances may be likened to inductances (e.g., L) of the inductors $L_{12}$ and $L_{13}$ modified by the coupling factor, k. Teachings according to the present disclosure use such equivalent circuit as a model to implement functionality of the selectively coupled power splitter.

Figure 2B:
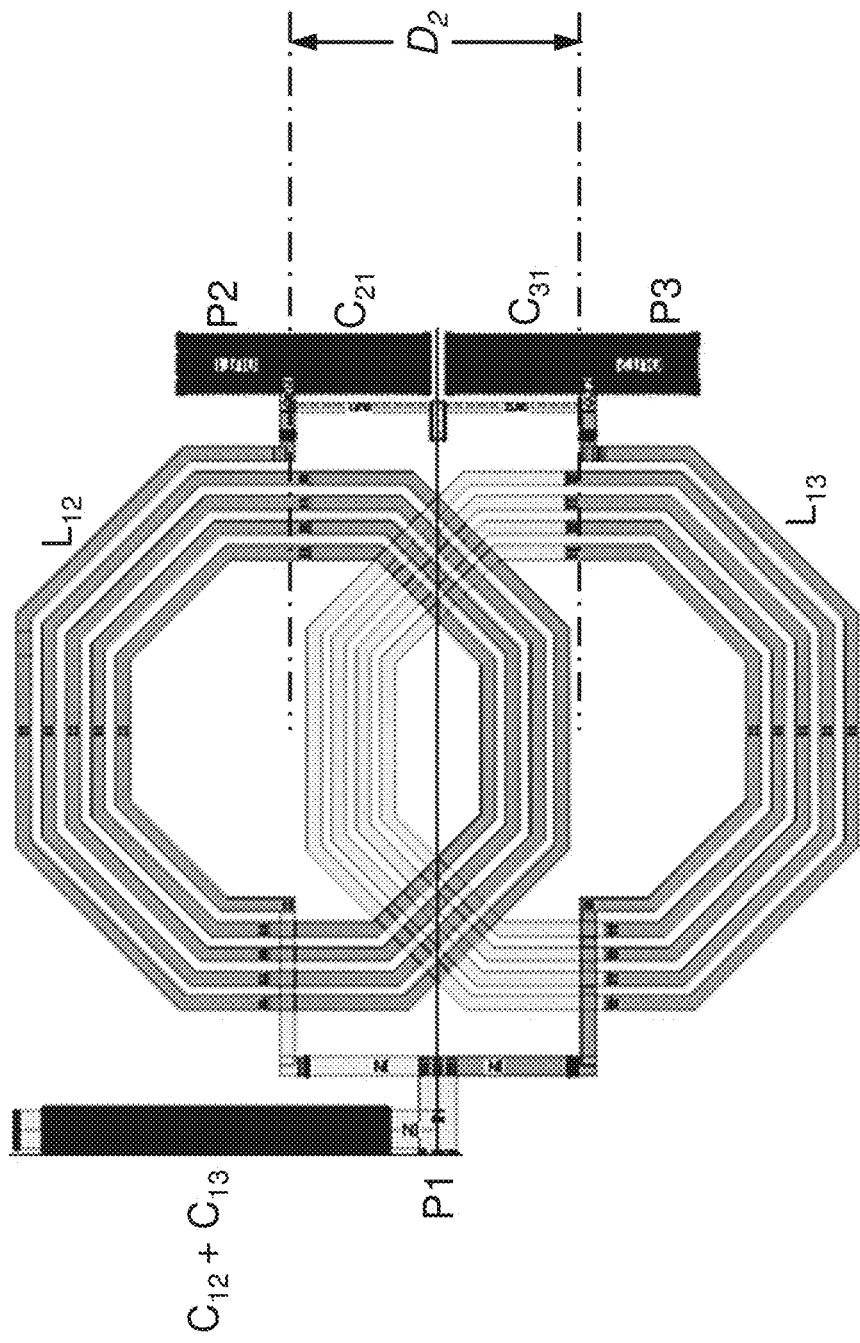
FIG. 2B shows an exemplary physical layout of two inductors used in the selectively coupled power splitter of FIG. 2A.

FIG. 2B shows an exemplary physical layout of two inductively coupled inductors ($L_{12}$, $L_{13}$) that may be used in the selectively coupled power splitter (200A) of FIG. 2A. In contrast to the exemplary physical layout described above with reference to FIG. 1D, the respective coils (also annotated as $L_{12}$, $L_{13}$) that form the two inductors ($L_{12}$, $L_{13}$) in FIG. 2B may be positioned at a sufficiently small relative distance (D2, e.g., distance relative to centers of the two coils, optionally combined with a relative orientation of the two coils) so to create sufficient magnetic coupling between coils of the two inductors ($L_{12}$, $L_{13}$). Coupling of the respective magnetic fields between the two coils in turn generates a mutual inductance (e.g., M) between the two coils having an inductance equal to k*L, where k is a nonzero coupling factor with a magnitude that is smaller than one (e.g., |k|≤+1). As can be readily understood, provision of inductively coupled inductors via a reduction in relative separation/distance between the two inductors, can provide a reduction in physical die area used by the selectively coupled power splitter according to the present disclosure.

As known to a person skilled in the art, mutual inductance between two coils may be dependent on a number of factors (e.g., design parameters) in addition to a relative distance between the two coils, and including, for example, number of turns of each coil, cross section of each coil, relative orientation of the two coils, or relative direction of the turns of each coil. In other words, the nonzero coupling factor, k, of the selectively coupled power splitter (e.g., 200A of FIG. 2A) according to the present teachings may be provided by a combination of design parameters, each configured to affect the coupling factor, k. In some cases, designers may resort to simulation software to optimize a layout of the two coils of the selectively coupled power splitter according to the present teachings in order to provide a target nonzero coupling factor magnitude, |k|, with a target positive or negative sign.

Applicant of the present disclosure has found that a coupling factor, k, having a magnitude in a range from 0.15 to 0.45, and preferably from 02 to 0.4, may provide an increase in performance of the present selectively coupled power splitter (e.g., 200 of FIG. 2A) when compared to the prior art power splitter (e.g., 100B of FIG. 1B). Furthermore, Applicant of the present disclosure has found that a negative coupling factor within the described range may be preferred in some implementations, including for example, when increased isolation performance or insertion loss performance is desired. In particular, Applicant has found that a negative coupling factor equal to about −0.2 (e.g., in a range between −0.22 to −0.18) can be preferred for increased isolation performance for NRU band (5-7 GHZ) design example.

Figure 2C:
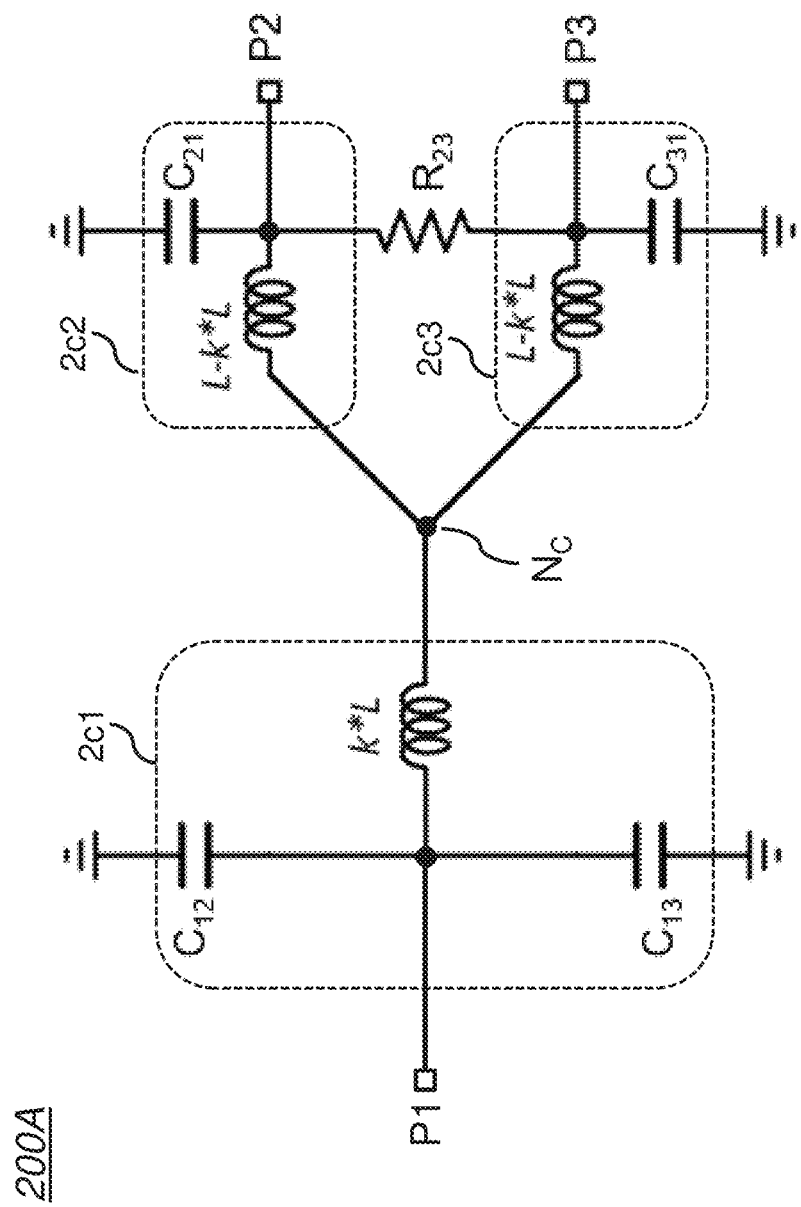
FIG. 2C shows stages of the selectively coupled power splitter of FIG. 2A.

FIG. 2C shows stages (2c1, 2c2, 2c3) of the selectively coupled power splitter (200A) of FIG. 2A. Because the nonzero coupling factor, k, introduces the common node, $N_c$, in the circuit of the selectively coupled power splitter (200A), a topology (e.g., equivalent topology, star topology) of the power splitter (200A) now includes a common branch (21c) connected between the port P1 and the common node, $N_c$, a second port branch (2c2) connected between the common node, $N_c$, and the port P2, and a third port branch (2c3) connected between the common node, $N_c$, and the port P3. In other words, a quarter wavelength transmission line (e.g., conduction path) between the port P1 and any of the two ports P2 or P3, is now provided by two cascaded L-C stages (e.g., 2c1 and 2c2 for P1 to P2, or 2c1 and 2c3 for P1 to P3) instead of a single L-C (resonant) stage of the prior art power splitter (e.g., 100B of FIG. 1B). It should be noted that the topology shown in FIG. 2C (and right side of the FIG. 2A) may not be representative of an actual physical layout (e.g., circuit) of the inductively coupled power spitter (200A), rather it may be considered as an equivalent model to optimize component values of the selectively coupled power splitter.

Such (equivalent) topology of the power splitter (200A) in turn allows some degree of freedom in selection of the respective component values (e.g., inductance and capacitance of the lumped elements) for implementation of the respective quarter wavelength transmission lines. In other words, in contrast to the prior art power splitter (e.g., 100B of FIG. 1B) where the component values are (essentially) fixed and interdependent for a given design (e.g., set of design parameters such as center frequency, characteristic impedance, phase), component values of the selectively coupled power splitter according to the present teachings can be selected separately for each of the stages (e.g., 2c1, 2c2, 2c3) and from a plurality of values that may be further based on different values of the nonzero coupling factor, k. In turn, teachings according to the present disclosure take advantage of such freedom available in the selection of the component values to evaluate and optimize one or more performance metrics of the selectively coupled power splitter, including, for example, isolation and/or insertion loss.

Flexibility in selection of the component values can be exemplified by considering, for example, the quarter wavelength transmission line between ports P1 and P2. As shown in FIG. 2C, such transmission line may be provided by the cascaded stages (2c1, 2c2). The stage (2c1) may provide matching to the port P1 independently from the matching provided by the stage (2c2) to the port P2, thereby providing some degree of freedom in selection of values of capacitors $C_{12}$ and $C_{13}$ of the stage (2c1) from values of the capacitor $C_{21}$ of the stage (2c2), based on different values of the inductance L and/or of the factor, k. Furthermore, the characteristic impedance between the ports P1 and P2 may be provided by a plurality of combinations of impedances provided by each of the two cascaded stages (2c1, 2c2), including for different values of the inductance L and/or of the factor, k.

With continued reference to FIG. 2C, the degree of freedom provided in the selection of the component values of the different stages may be advantageously used to increase an isolation performance between the two ports P2 and P3. For example, isolation between the two ports P2 and P3 may be a direct function of, for example, a capability of canceling at port P3, a signal traveling from port P2 to port P3 through the common node, $N_c$, with a signal traveling from port P2 to port P3 through the resistor, $R_{23}$. Accordingly, the component values of the two stages (2c2) and (2c3) may be (freely, with more freedom) selected to optimize the canceling of the two signals at the port P3 (and vice versa due to symmetry of design) while still being able to provide in combination with the (common) stage (2c1) the desired quarter wavelength transmission line functionality. It should be noted that differently from the prior art configuration (e.g., 100B of FIG. 1B), the two capacitors $C_{12}$ and $C_{21}$ of FIG. 2C may not necessarily have a same value and their values may be further based on the factor, k. Such degree of freedom in selection of the capacitor $C_{21}$ of the stage (2c2), as well as the capacitor $C_{31}$ of the stage (2c3), may be further used to optimize performance of the present selectively coupled power splitter with respect to, for example, insertion loss rather than isolation (e.g., reference to FIG. 3A later described).

Figure 2D:
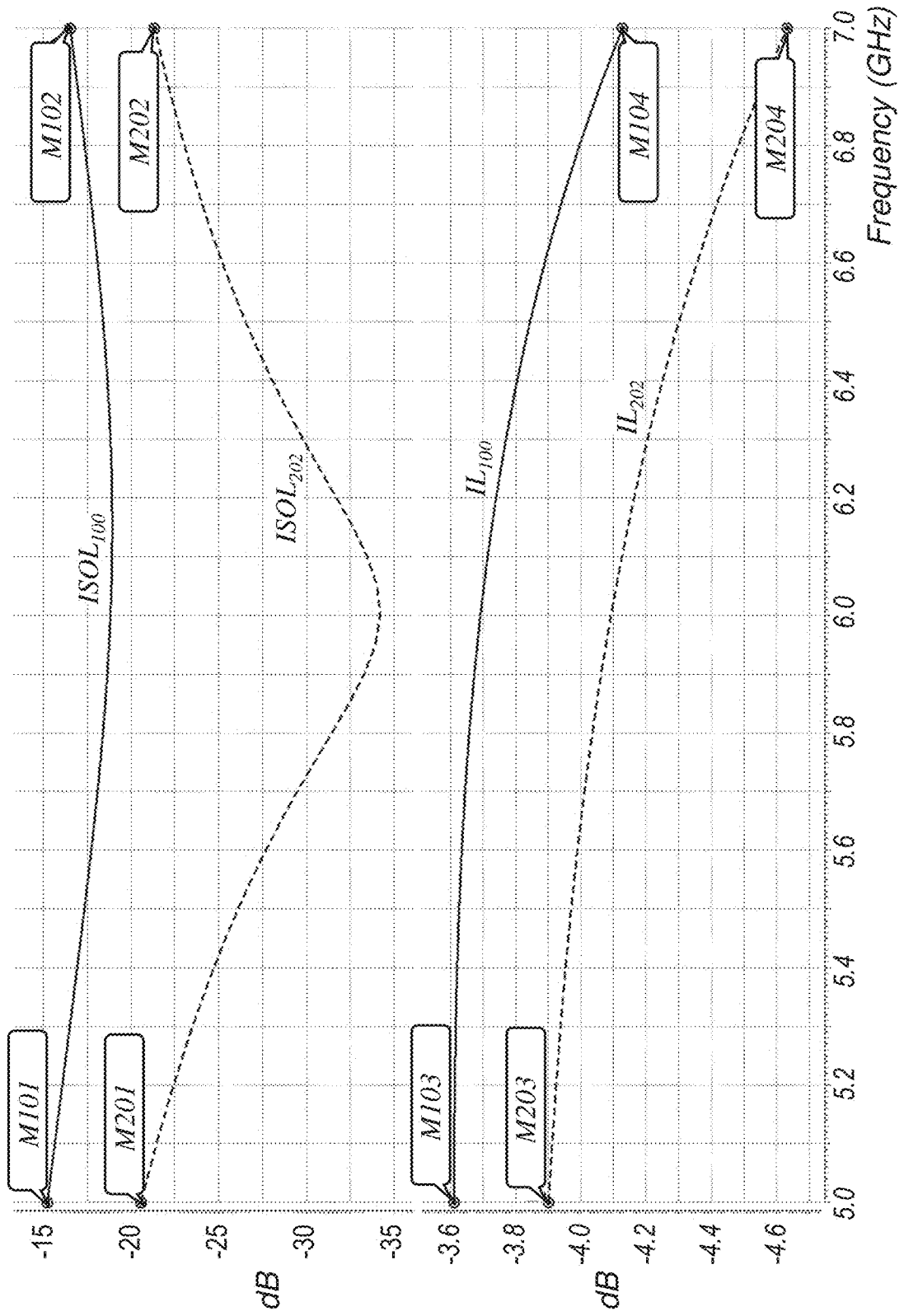
FIG. 2D shows graphs representative of performance of the selectively coupled power splitter of FIG. 2A contrasted to the performance prior art power splitter of FIG. 1B.

FIG. 2D shows graphs representative of performance of the selectively coupled power splitter (200A) of FIG. 2A contrasted to the performance prior art power splitter (100B) of FIG. 1B. In particular, as shown in FIG. 2D, isolation performance, $ISOL_{202}$, of the selectively coupled power splitter of FIG. 2A is increased when compared to the isolation performance, $ISOL_{100}$, of the prior art power splitter (100B) of FIG. 1B at a center frequency of about 6.0 GHz. However, such increase in isolation performance may come at a cost of a slightly reduced (and acceptable in some cases) insertion loss performance (e.g., about 0.4 dB, $IL_{202}$ versus $IL_{100}$). Furthermore, if considering performance over an entirety of a frequency range (e.g., band) from 5.0 GHz to 7.0 GHz, over 6 dB increase in isolation performance (e.g., difference between points M201, M101 and M202, M102) at a cost of a slight decrease of less than about 0.4 dB in insertion loss performance (e.g., difference between points M203, M103 and M204, M104) may be provided by the selectively coupled power splitter. It should be noted that the graphs shown in FIG. 2D are representative of isolation and insertion loss performances for optimized component values of the respective power splitters (e.g., 200A, 100B), including a nonzero coupling factor, k=−0.2, for the selectively coupled power splitter (200A).

Figure 2E:
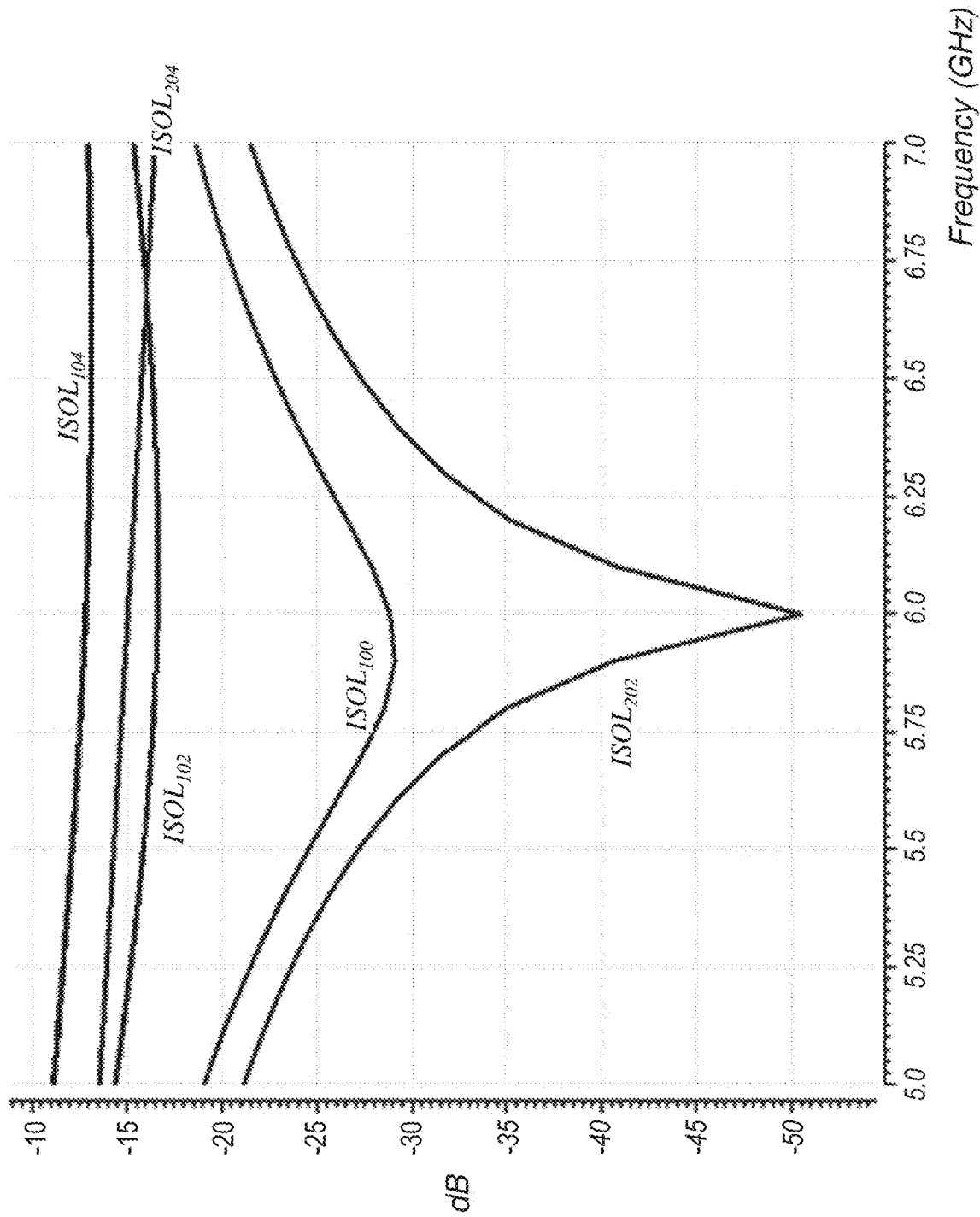
FIG. 2E shows graphs representative of a series optimization with respect to a coupling factor of the selectively coupled power splitter of FIG. 2A.

It should be noted that although the selectively coupled power splitter according to the present teachings may allow selection of different component values for optimization of a performance metric (e.g., isolation, insertion loss or other), optimization of different performance metrics may result in different values of the nonzero factor, k. In other words, one may elect to optimize with respect to isolation and obtain graphs similar to graphs (e.g., $IL_{202}$, $ISOL_{202}$) shown in FIG. 2D, or with respect to insertion loss and obtain graphs different from those shown in FIG. 2D. Furthermore, as shown in the graphs of FIG. 2E, optimization of a performance of the selectively coupled power splitter (e.g., 200 of FIG. 2A) according to the present disclosure may include a series optimization for different values of the coupling factor, k, and selecting an optimized configuration that may provide the better performance. For example, FIG. 2E shows that for a coupling factor, k=−0.2, a higher isolation performance (e.g., graph $ISOL_{202}$) may be provided at about a center frequency of 6.0 GHz when compared to other values of the coupling factor, including for k=0; +0.2; +0.4; −0.4 respectively represented by graphs $ISOL_{100}$; $ISOL_{102}$; $ISOL_{104}$; $ISOL_{204}$.

Figure 3A:
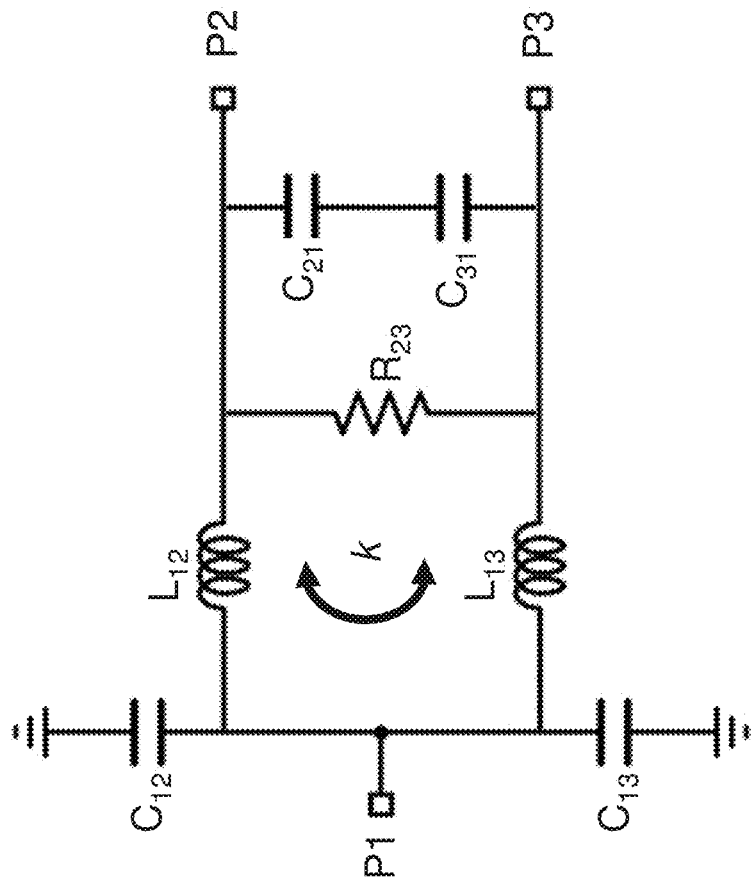
FIG. 3A shows a representative schematic of another selectively coupled power splitter according to an embodiment of the present disclosure.

FIG. 3A shows a representative schematic of another selectively coupled power splitter (300A) according to an embodiment of the present disclosure. The configuration (300A) shown in FIG. 3A is based on the configuration (200A) of FIG. 2A with a difference in that the capacitors $C_{21}$ and $C_{31}$ of FIG. 3A are not connected to a reference ground, rather to one another (at one terminal and to the respective ports at the other terminal) at a node that may not be connected to (e.g., the reference ground), rather left as a floating node. In other words, as can be seen in FIG. 3A, the two capacitors $C_{21}$ and $C_{31}$ may be connected in series, and their series combination connected in parallel with the resistor $R_{23}$. Such combination may in turn allow to reduce the value of the two capacitors $C_{21}$ and $C_{31}$, which in turn, as shown in the graphs of FIG. 3B, may provide an increase in an insertion loss performance while maintaining a similar isolation performance when compared to the configuration of FIG. 2A.

Figure 3B:
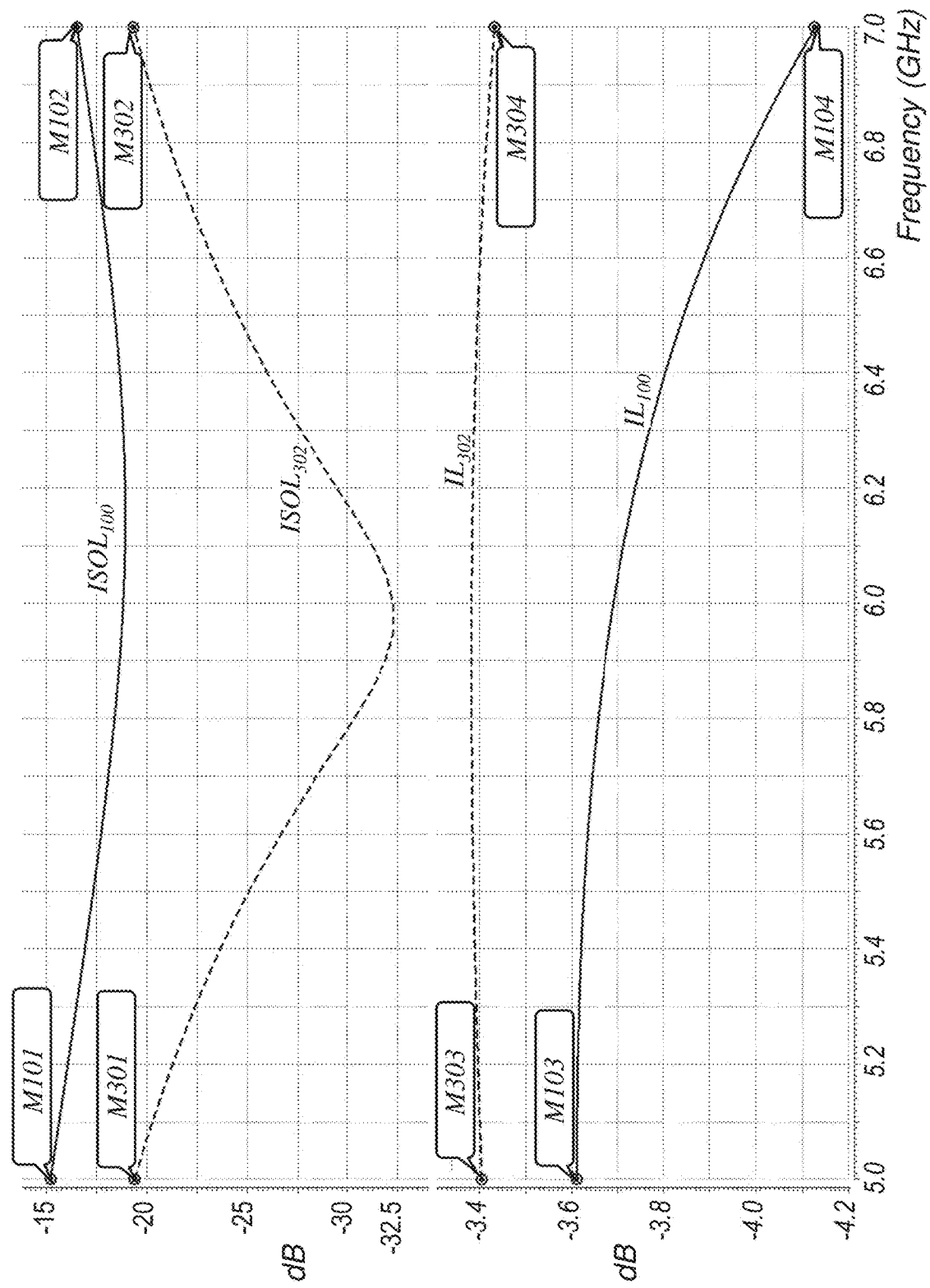
FIG. 3B shows graphs representative of performance of the selectively coupled power splitter of FIG. 3A contrasted to the performance of the prior art power splitter of FIG. 1B.

FIG. 3B shows graphs representative of performance of the selectively coupled power splitter (300A) of FIG. 3A contrasted to the performance prior art power splitter (100B) of FIG. 1B. In particular, as shown in FIG. 3B, isolation performance, $ISOL_{302}$, of the selectively coupled power splitter of FIG. 3A is increased when compared to the isolation performance, $ISOL_{100}$, of the prior art power splitter (100B) of FIG. 1B at a center frequency of about 6.0 GHz. Furthermore, and in contrast to the configuration (200A) of FIG. 2A, insertion loss performance, $IL_{302}$, of the selectively coupled power splitter of FIG. 3A is increased when compared to the insertion loss performance, $IL_{100}$, of the prior art power splitter (100B) of FIG. 1B at a center frequency of about 6.0 GHz. Furthermore, if considering performance over an entirety of a frequency range (e.g., band) from 5.0 GHz to 7.0 GHz, over 6 dB increase in isolation performance (e.g., difference between points M301, M101 and M302, M102) and over about 0.2 dB increase in insertion loss performance (e.g., difference between points M303, M103 and M304, M104) may be provided by the selectively coupled power splitter (300A). It should be noted that the graphs shown in FIG. 3B are representative of isolation and insertion loss performances for optimized component values of the respective power splitters (e.g., 300A, 100B), including a nonzero coupling factor, k=−0.2, for the selectively coupled power splitter (300A).

Figure 4A:
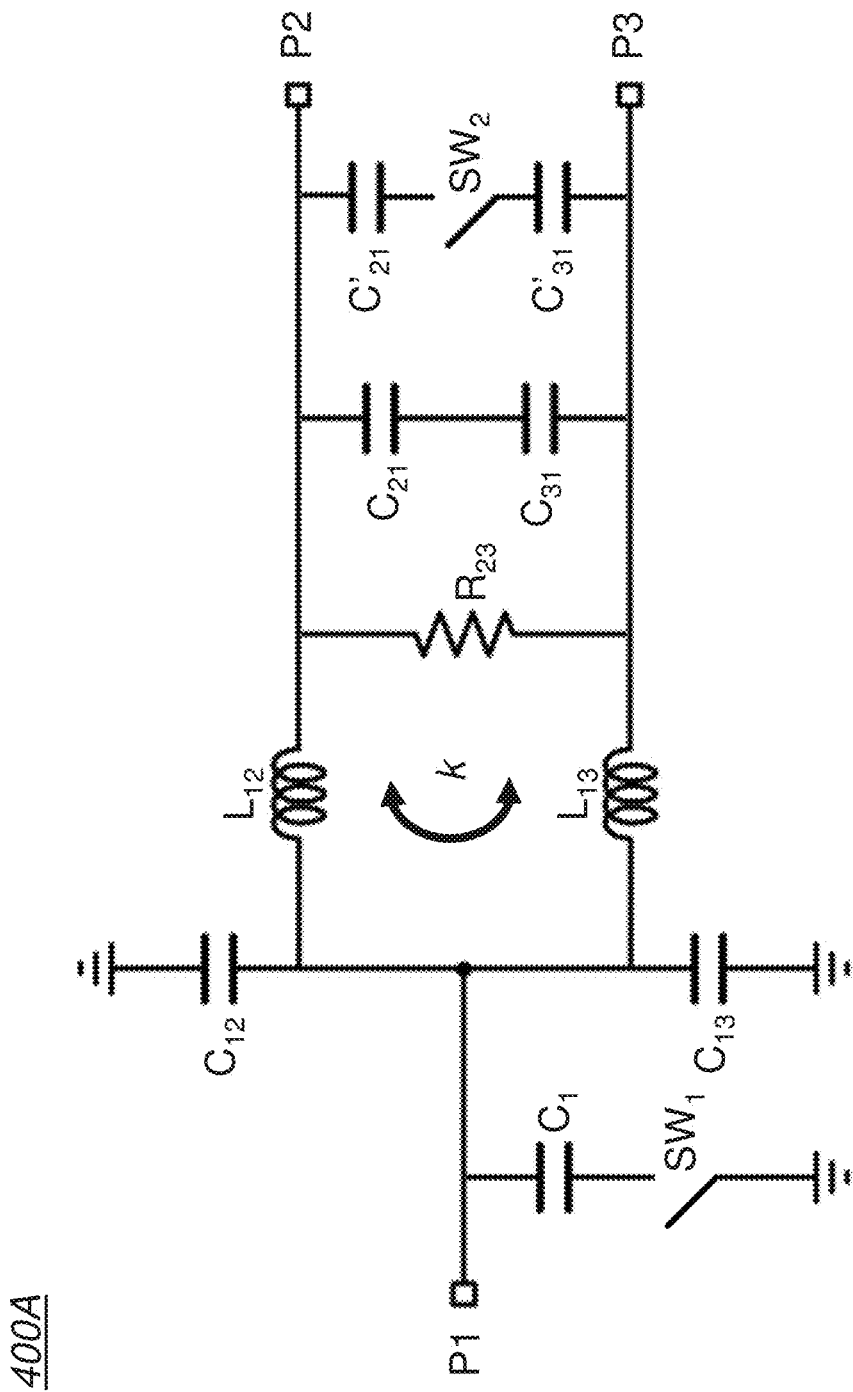
FIG. 4A shows a representative schematic of a configurable selectively coupled power splitter according to an embodiment of the present disclosure.

FIG. 4A shows a representative schematic of a configurable selectively coupled power splitter (400A) according to an embodiment of the present disclosure. As shown in FIG. 4A, the power splitter (400A) may be based on the power splitter (300A) of FIG. 3A with added switchable capacitances respectively coupled at the port P1 and between the ports P2 and P3. For example, a capacitor $C_1$ may be selectively coupled between the port P1 and the reference ground via a switch $SW_1$, and capacitors, $C'_{21}$ and $C'_{31}$, may be selectively coupled between the ports P2 and P3 via a switch $SW_2$. Accordingly, when the switch $SW_1$ is closed, the capacitor $C_1$ may be coupled between the port P1 and the reference ground (therefore in parallel with capacitors $C_{12}$ and $C_{13}$), and when the switch $SW_2$ is closed, the capacitors, $C'_{21}$ and $C'_{31}$, may be coupled between the ports P2 and P3 (therefore in parallel with capacitors $C_{21}$ and $C_{31}$).

With continued reference to FIG. 4A, the effect of the coupling the capacitors (e.g., $C_1$, $C'_{21}$, $C'_{31}$) to the ports (e.g., P1, P2, P3) of the power splitter (400A) may include shifting/changing of the resonant frequency of the respective stages (e.g., 2c1, 2c2, 2c3 of FIG. 2C as applied to FIG. 4A) while providing an increased performance metric (e.g., isolation, insertion loss) at a narrower bandwidth of operation of the power splitter (400A). In other words, the switchable capacitances (e.g., $C_1$, $C'_{21}$, $C'_{31}$) may be (simultaneously) switched in to provide an optimized narrowband mode of operation of the power splitter (400A) and (simultaneously) switched out to provide a (relatively) wideband mode of operation of the power splitter (400A). When switched in, the switchable capacitances may serve to select a sub-band mode of operation of the power splitter (400A) with increased performance metrics as opposed to a wideband mode of operation when switched out. The switchable capacitances may be configured to provide a plurality of different capacitances (e.g., programmable/settable/controllable/configurable/adjustable capacitance) in correspondence to a plurality of different sub-band modes of operation. In the alternative, or in addition, a plurality of different switchable capacitances (each having different capacitances) similar to ones shown in FIG. 4A may be used to provide a plurality of different sub-band modes of operation. In some implementations, the combination of the capacitors ($C_1$, $C_{12}$, $C_{13}$) with the switch $SW_1$, or capacitors ($C_{21}$, $C'_{21}$) and/or ($C_{31}$, $C'_{31}$) with the switch $SW_2$, may be provided by respective switchable programmable/settable/controllable/configurable/adjustable capacitors.

Figure 4B:
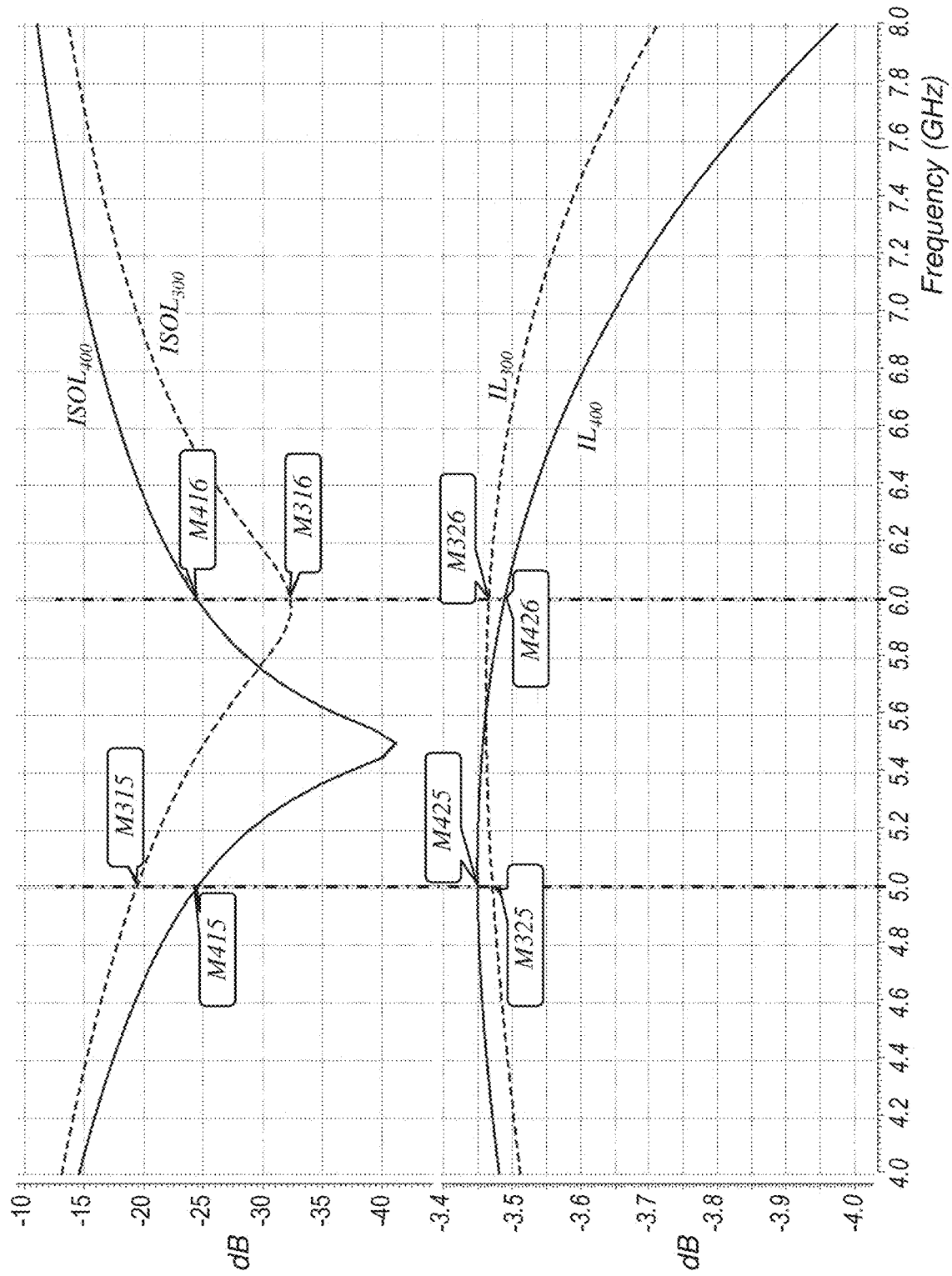
FIG. 4B and FIG. 4C show graphs representative of performance of the configurable selectively coupled power splitter of FIG. 4A contrasted to the performance of the selectively coupled power splitter of FIG. 3A.
Figure 4C:
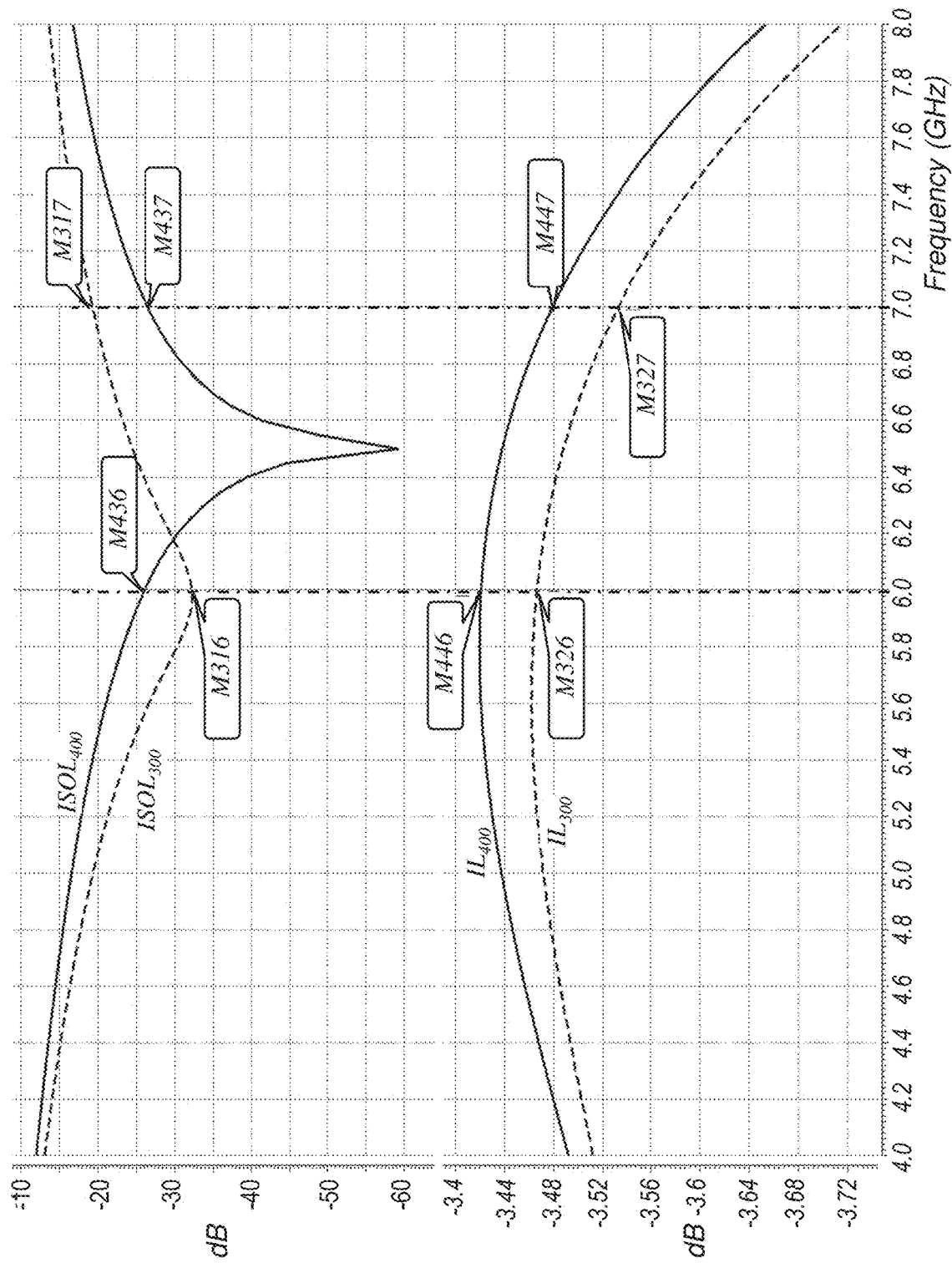

FIG. 4B and FIG. 4C show graphs representative of performances of the configurable selectively coupled power splitter (400A) of FIG. 4A contrasted to performances of the selectively coupled power splitter (300A) of FIG. 3A. As described above, the power splitter (300A) may be designed to operate over an exemplary wideband frequency range that spans from 5.0 GHz to 7.0 GHz. In other words, the power splitter (300A) may be designed/optimized such that over such wideband frequency range a minimum performance for isolation (e.g., $ISOL_{300}$) and/or insertion loss (e.g., $IL_{300}$) may be provided. For example, minimum performance for isolation (e.g., about −20 dB) of the power splitter (300) may be represented by points M315 of FIG. 4B and M317 of FIG. 4C, and minimum performance for insertion loss (e.g., of the power splitter (300A) may be represented by point M327 of FIG. 4C). Design/optimization of the power splitter (300A) may result to a coupling factor (e.g., k=−0.2) that once selected may not change in the implemented circuit (e.g., since such coupling factor may represent physical attributes of the two coils of the power splitter).

However, by introducing switchable capacitances (e.g., $C_1$, $C'_{21}$, $C'_{31}$ of FIG. 4A), increased performance of the power splitter (400A) over a narrower frequency range (e.g., span of 1 GHZ) may be provided. This can be seen in graphs $ISOL_{400}$ and $IL_{400}$ of FIG. 4B for a case of an exemplary narrowband frequency range that spans from 5.0 GHz (e.g., points M415 and M425) to 6.0 GHz (e.g., points M416 and M426), within which increased performance for isolation with substantially equal performance for insertion loss is provided when compared to the graphs $ISOL_{300}$ (e.g., between points M315 and M316) and $IL_{300}$ (e.g., between points M325 and M326) of FIG. 4B. Likewise, as can be seen in graphs $ISOL_{400}$ and $IL_{400}$ of FIG. 4C for a case of an exemplary narrowband frequency range that spans from 6.0 GHz (e.g., points M436 and M446) to 7.0 GHz (e.g., points M437 and M447), within which increased performance for isolation with substantially equal performance for insertion loss is provided when compared to the graphs $ISOL_{300}$ (e.g., between points M316 and M317) and $IL_{300}$ (e.g., between points M326 and M327) of FIG. 4C. It should be noted that performances of the power splitter (400A) with the switchable capacitances not switched in (e.g., switches $SW_1$ and $SW_2$ of FIG. 4A OFF/deactivated) may be likened to the performance of the power splitter (300A) of FIG. 3A. Furthermore, it should be noted that the sub-band modes of operation (e.g., narrowband 5-6 GHz and 6-7 GHz) described above with respective performances shown in FIG. 4B and FIG. 4C, may each be provided by coupling different (pairs of) capacitances (e.g., $C_1$, $C'_{21}$, $C'_{31}$ of FIG. 4A) to the ports (e.g., P1, P2, P3) of the power splitter (400A).

Figure 5:
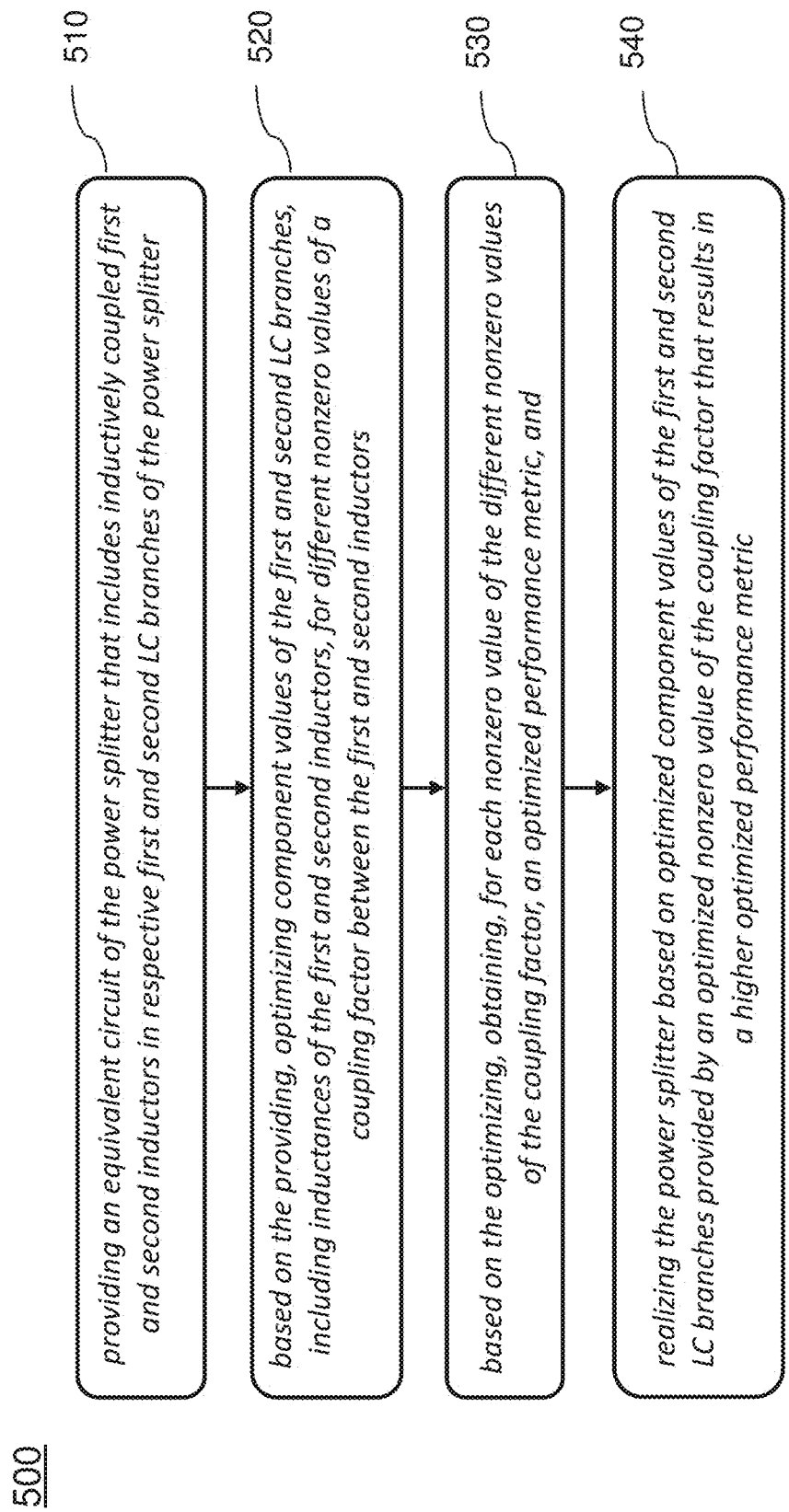
FIG. 5 is a process chart showing various steps of a method according to an embodiment of the present disclosure for increasing a performance metric of a power splitter.

FIG. 5 is a process chart (500) showing various steps of a method for increasing a performance metric of a power splitter. As can be seen in FIG. 5, such steps comprise: providing an equivalent circuit of the power splitter that includes inductively coupled first and second inductors in respective first and second LC branches of the power splitter, per step (510); based on the providing, optimizing component values of the first and second LC branches, including inductances of the first and second inductors, for different nonzero values of a coupling factor between the first and second inductors, per step (520); based on the optimizing, obtaining, for each nonzero value of the different nonzero values of the coupling factor, an optimized performance metric, per step (530); and realizing the power splitter based on optimized component values of the first and second LC branches provided by an optimized nonzero value of the coupling factor that results in a higher optimized performance metric, per step (540).

It should be noted that the various embodiments of the selectively coupled power splitter according to the present disclosure, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A power splitter, comprising:
   a first LC branch connected between a first port and a second port;
   a second LC branch connected between the first port and a third port;
   a termination resistor connected between the second port and the third port;
   a first port capacitor coupled between a reference ground and the first port; and
   a second port capacitor in series connection with a third port capacitor, the second port capacitor coupled to the second port and the third port capacitor coupled to the third port,
   wherein the first and the second LC branches comprise respective first and second inductors, and
   wherein the first inductor and the second inductor are inductively coupled according to a predefined nonzero coupling factor.

2. The power splitter according to claim 1, wherein component values of the first and second LC branches, including the first and second inductors, are selected based on an equivalent circuit of the power splitter that includes the coupling factor.

3. The power splitter according to claim 2, wherein selection of the component values is further based on a performance metric over a frequency range of operation that includes at least one of: a) an isolation between the second port and the third port; or b) an insertion loss.

4. The power splitter according to claim 2, wherein the equivalent circuit includes a star topology comprising a mutual inductance provided by the coupling factor, the mutual inductance connected between the first port and a common node of the star topology.

5. The power splitter according to claim 4, wherein:
   the star topology further comprises first and second equivalent LC branches respectively connected between the common node and respective second and third ports, and the first and second equivalent LC branches comprise respective inductances of the first and second inductors modified by the coupling factor.

6. The power splitter according to claim 5, wherein:
the respective inductance of the first equivalent LC branch is equal to the inductance of the first inductor minus the mutual inductance, and
the respective inductance of the second equivalent LC branch is equal to the inductance of the second inductor minus the mutual inductance.

7. The power splitter according to claim 1, wherein a magnitude of the coupling factor is in a range from 0.15 to 0.45.

8. The power splitter according to claim 7, wherein the coupling factor is negative.

9. The power splitter according to claim 1, wherein a relative distance and orientation between respective coils of the first and second inductors is configured to provide the coupling factor.

10. The power splitter according to claim 1, wherein respective coils of the first and second inductors partially overlap to provide the coupling factor.

11. A power splitter, comprising:
a first LC branch coupled between a first port and a second port, the first LC branch comprising a first inductor;
a second LC branch coupled between the first port and a third port, the second LC branch comprising a second inductor; and
a termination resistor coupled between the second port and the third port,
wherein:
the first inductor and the second inductor are inductively coupled according to a predefined nonzero coupling factor,
the first LC branch comprises a shunted capacitor connected to the first port and a second port capacitor connected to the second port,
the second LC branch comprises a shunted capacitor connected to the first port and a third port capacitor connected to the third port, and
the second port capacitor is in series connection with the third port capacitor.

12. The power splitter according to claim 11, wherein:
the second port capacitor and the third port capacitor include adjustable capacitances.

13. The power splitter according to claim 12, wherein:
the shunted capacitor of the first or second LC branch includes an adjustable capacitance.

14. The power splitter according to claim 11, wherein:
the series connection is provided through a switch that selectively connects the second port capacitor to the third port capacitor.

15. The power splitter according to claim 1, wherein:
the second port capacitor and the third port capacitor include adjustable capacitances.

16. The power splitter according to claim 15, wherein:
the shunted capacitor of the first or second LC branch includes an adjustable capacitance.

17. The power splitter according to claim 1, wherein:
the series connection is provided through a switch that selectively connects the second port capacitor to the third port capacitor.

18. The power splitter according to claim 11, wherein component values of the first and second LC branches, including the first and second inductors, are selected based on an equivalent circuit of the power splitter that includes the coupling factor.

19. The power splitter according to claim 18, wherein selection of the component values is further based on a performance metric over a frequency range of operation that includes at least one of: a) an isolation between the second port and the third port; or b) an insertion loss.

20. The power splitter according to claim 18, wherein the equivalent circuit includes a star topology comprising a mutual inductance provided by the coupling factor, the mutual inductance connected between the first port and a common node of the star topology.

21. The power splitter according to claim 20, wherein:
the star topology further comprises first and second equivalent LC branches respectively connected between the common node and respective second and third ports, and
the first and second equivalent LC branches comprise respective inductances of the first and second inductors modified by the coupling factor.

22. The power splitter according to claim 21, wherein:
the respective inductance of the first equivalent LC branch is equal to the inductance of the first inductor minus the mutual inductance, and
the respective inductance of the second equivalent LC branch is equal to the inductance of the second inductor minus the mutual inductance.

23. The power splitter according to claim 11, wherein a magnitude of the coupling factor is in a range from 0.15 to 0.45.

24. The power splitter according to claim 23, wherein the coupling factor is negative.

25. The power splitter according to claim 11, wherein a relative distance and orientation between respective coils of the first and second inductors is configured to provide the coupling factor.

26. The power splitter according to claim 11, wherein respective coils of the first and second inductors partially overlap to provide the coupling factor.

* * * * *